(12) United States Patent
Kammerl et al.

(10) Patent No.: US 6,241,331 B1
(45) Date of Patent: Jun. 5, 2001

(54) SHEET-METAL CASING WITH SEAL

(75) Inventors: Kurt Kammerl, Klettgau (DE); Gustav Kölbl, Hedingen (CH); Enrique Munoz, Muttenz (CH); Markus Vestner, Büsingen (CH)

(73) Assignee: Asea Brown Boveri AG, Baden (CH)

( * ) Notice: Subject to any disclaimer, the term of this patent is extended or adjusted under 35 U.S.C. 154(b) by 0 days.

(21) Appl. No.: 09/353,387

(22) Filed: Jul. 15, 1999

(30) Foreign Application Priority Data

Jul. 16, 1998 (DE) .............................................. 198 31 996

(51) Int. Cl.7 .................................................. A47G 29/00
(52) U.S. Cl. ......................................... 312/265.5; 312/296
(58) Field of Search ................................ 312/257.1, 263, 312/265.5, 265.6, 296, 297, 100, 101, 102; 52/542, 528; 277/593

(56) References Cited

U.S. PATENT DOCUMENTS

| | | |
|---|---|---|
| 1,723,307 | 8/1929 | Sipe . |
| 3,325,237 * | 6/1967 | Dirk et al. ............................ 312/296 |
| 3,363,953 * | 1/1968 | Lacan ................................... 312/100 |
| 5,169,163 * | 12/1992 | Udagawa et al. ..................... 277/593 |
| 5,184,879 * | 2/1993 | Brossardt et al. ............ 312/257.1 X |
| 5,382,753 * | 1/1995 | Farley ............................... 312/263 X |
| 5,511,796 * | 4/1996 | Udagawa ............................ 277/593 |
| 5,532,427 | 7/1996 | Stoyko . |
| 5,573,319 * | 11/1996 | Dirk ..................................... 312/100 |
| 5,685,118 * | 11/1997 | Simpson ........................... 52/542 X |
| 5,957,555 * | 9/1999 | Kohler et al. ........................ 312/100 |

FOREIGN PATENT DOCUMENTS

| | | |
|---|---|---|
| 2 320 268 | 10/1994 | (DE) . |
| 4336187A1 | 4/1995 | (DE) . |
| 4336285A1 | 4/1995 | (DE) . |
| 4439622C1 | 11/1995 | (DE) . |
| 19544432A1 | 6/1997 | (DE) . |
| 1137790 * | 6/1957 | (FR) ................................ 312/265.5 |
| 2 151 461 | 7/1985 | (GB) . |
| 2 291 938 | 2/1996 | (GB) . |

* cited by examiner

*Primary Examiner*—Peter M. Cuomo
*Assistant Examiner*—Hanh V. Tran
(74) *Attorney, Agent, or Firm*—Burns, Doane, Swecker & Mathis, L.L.P.

(57) ABSTRACT

The sheet-metal casing comprises at least two sheet-metal parts (1, 2) and has a plastic seal (9) arranged in between. A first sheet-metal part (1) is folded over along the seal (9) to form a fold (10) and comes into contact with the second part (2) in such a way that, in addition to the fold (10), a gap (13) for accommodating the seal (9) forms. The fold (10) ensures good electrical contact between the two parts (1, 2) and thus good screening. At the same time, it defines the width of the gap (13), so that the seal (9) is subjected to defined compression.

7 Claims, 2 Drawing Sheets

SHEET-METAL CASING WITH SEAL

BACKGROUND OF THE INVENTION

1. Field of the Invention

The invention relates to a sheet-metal casing having a plastic seal according to the preamble of claim 1. Such casings are used in particular for electrical appliances in which sealing and electromagnetic screening to the outside is important.

2. Discussion of Background

In known designs of casings of this type, the seal is clamped in place between the sheets of the casing parts. The casing parts are then pressed against one another, so that the seal is compressed. Excessive compression, however, should be avoided in order to avoid damage to the seal. However, compression which is too weak or settling of the seal leads to undesirable slackening of the connection. In addition, for electromagnetic screening, contact strips covering the sealing gap must be attached.

SUMMARY OF THE INVENTION

Accordingly, one object of the invention is to provide a novel sheet-metal casing of the type mentioned at the beginning in such a way that these problems are avoided in the simplest possible way. This object is achieved by a sheet-metal casing as claimed in claim 1. One of the casing parts therefore forms a step along the seal and comes into contact with the other casing part. The arrangement is selected in such a way that, in addition to the step, a gap for accommodating the seal forms between the casing parts. In this design, the step thus performs two functions: on the one hand, it ensures a prominence for forming the electrical contact between the casing parts, so that good electromagnetic screening is ensured. On the other hand, it forms the mechanical contact and thus the bearing region between the casing parts. If the casing parts are pressed against one another, it absorbs the corresponding forces, and excessive compression of the seal is avoided.

The configuration according to the invention of the sealing region may be achieved merely by bending or folding the casing parts, which simplifies manufacture.

In this case, the sheet is preferably bent over to form a fold, which forms the step and at the same time reinforces the marginal region of the sheet.

The two casing parts are preferably bent inward in the sealing region and form sealing surfaces, between which the seal comes to lie. In addition, the inner margin of the, preferably bottom, casing part may be bent over in such a way that it covers the fold to the inside. As a result, better screening and, if need be, water sealing are achieved.

To more effectively prevent ingress of water, the sealing surfaces may also be arranged in such a way that they rise inward toward the top.

Suitable tension means are preferably provided in order to press the two casing parts against one another.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
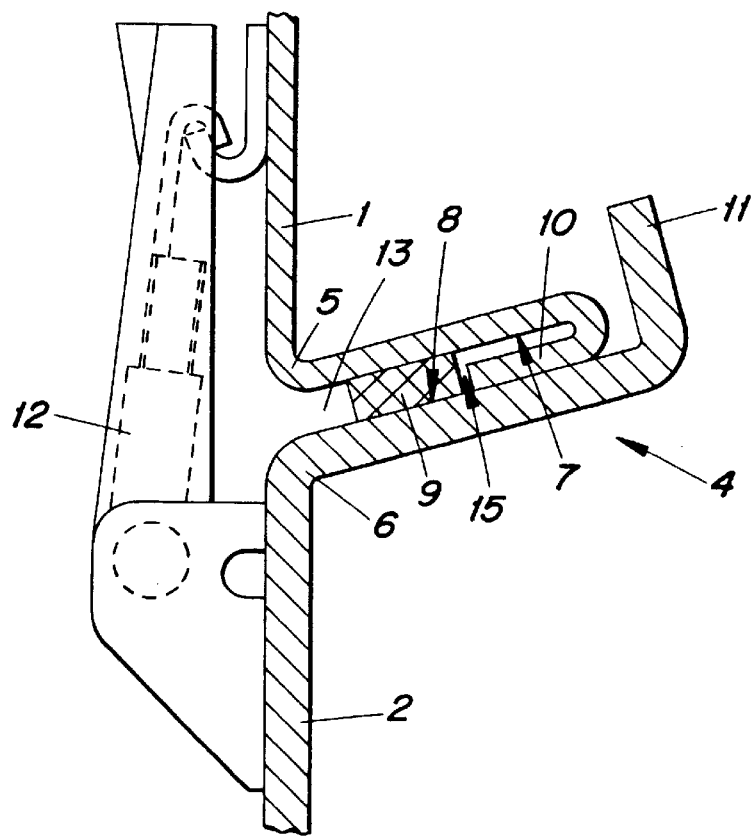
FIG. 1 shows a first embodiment according to the invention of the sealing region of a sheet-metal casing.

Referring now to the drawings, wherein like reference numerals designate identical or corresponding parts throughout the several views, FIG. 1 shows a vertical section through a first embodiment of a sheet-metal casing according to the invention. In this case, only the region of the seal is shown. The configuration of the rest of the casing may be adapted in a known manner to the respective mechanical and electrical requirements. The casing is made at least partly of sheet metal. However, casings which are not made solely of sheet metal are also to be designated as sheet-metal casings.

In the present case, the sheet-metal casing comprises two sheet-metal parts 1, 2, which are each made from a suitably bent sheet. The parts 1, 2 screen the interior 3 of the casing from the outside.

In the sealing region 4, the two sheet-metal parts 1, 2 are bent inward along edges 5, 6 and form two parallel sealing surfaces 7, 8, between which a plastic seal 9 is arranged.

The top, first casing part 1 is folded over by 180° at its inner margin and forms a fold 10, which is sealed off from the outside by the seal 9. The bottom, second casing part 2 is bent upward by 90° at its inner margin and forms a tongue 11.

A tension device 12, which pulls the casing parts 1, 2 against one another, is arranged on the outside of the casing between the two casing parts 1, 2.

By the pull of the tension device 12, the fold 10 is pressed against the sealing surface 8 of the second casing part 2 and forms a reliable electrical connection between the two parts. As a result, a good screening effect against electromagnetic immissions and emissions is achieved. At the same time, the fold 10 also forms the mechanical contact between the casing parts 1, 2. It forms a step 15, which extends along the seal and acts as a spacer for forming a gap 13 between the sealing surfaces 7, 8. The seal 9 is dimensioned in such a way that it finds space along the step 15 in this gap 13 under slight compression. Defined compression of the seal 9 is therefore ensured irrespective of the tensile force of the tension device 12 and the weight of the top casing part.

As can be seen from FIG. 1, the two sealing surfaces 7, 8 rise upward toward the interior 3 of the casing. This prevents water from being able to flow inward in the event of a possible failure of the seal 9.

Figure 2:
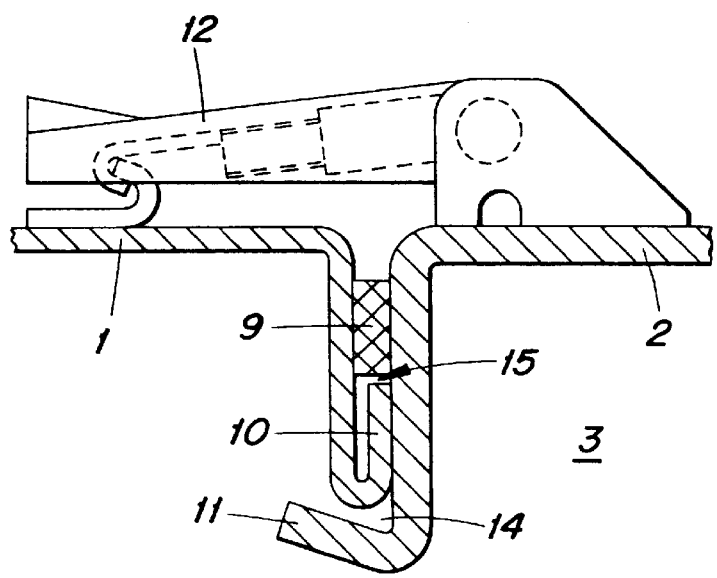
FIG. 2 shows a second embodiment according to the invention of the sealing region.

FIG. 2 shows a second embodiment of the sealing region. In this case, the seal 9 runs horizontally. The construction of the sealing region corresponds essentially to that according to FIG. 1. Here, however, the tongue 11 is bent slightly further, so that it forms a channel 14 for collecting any ingress of water. The fold 10 in turn forms a mechanical step, which extends along the seal 9.

The two figures show only two of the possible embodiments of the sealing region. Thus it is also conceivable, for example, to form the fold 10 or the step 15 on the bottom casing part 2 or to provide one fold each on both casing parts. In these cases, the fold itself in each case forms a channel for collecting leakage water.

Figure 3:
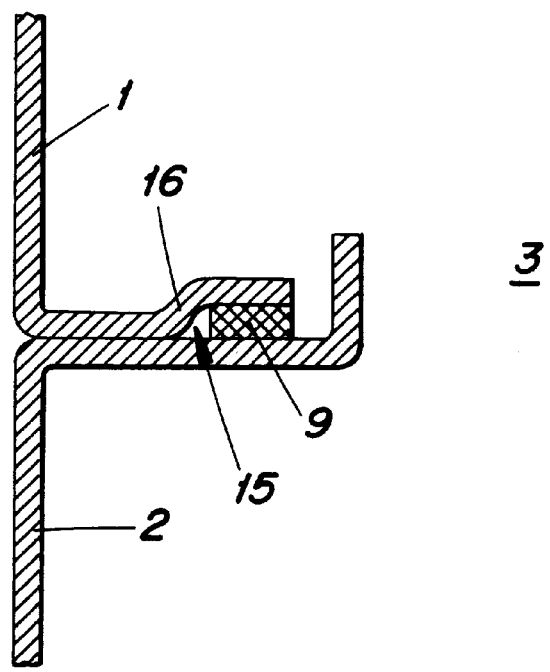
FIG. 3 shows a third embodiment according to the invention of the sealing region with inner seal.

FIG. 3 shows a further embodiment of the invention, in which the step 15 is not formed by a fold but by a stepped bending point 16 in the sheet of the first casing part 1. In this embodiment, the seal 9 lies inside the contact region of the two casing parts.

Figure 4:
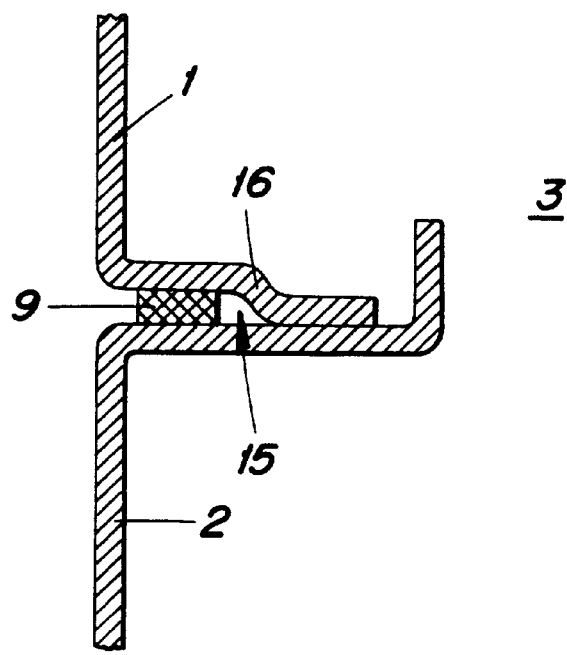
FIG. 4 shows a fourth embodiment according to the invention of the sealing region.

Finally, FIG. 4 shows an embodiment similar to that according to FIG. 3, but in this case the seal 9 lies outside the contact region of the two casing parts. Here, too, the sheet of the first casing part is bent in a stepped manner in order to form the step 15, which creates the space for accommodating the seal 9.

To simplify the representation, the tension device 12 is not shown in FIGS. 3 and 4.

In all these embodiments, a weatherproof seal which provides good electrical screening is obtained between the two casing parts, although the manufacture of the casing remains simple.

Obviously, numerous modifications and variations of the present invention are possible in light of the above teachings. It is therefore to be understood that, within the scope of the appended claims, the invention may be practiced otherwise than as specifically described herein.

LIST OF DESIGNATIONS

1 First casing part
2 Second casing part
3 Interior of the casing
4 Sealing region
5 First folding edge
6 Second folding edge
7 First sealing surface
8 Second sealing surface
9 Seal
10 Fold
11 Tongue
12 Tension device
13 Gap
14 Channel
15 Step
16 Bending point

What is claimed as new and desired to be secured by Letters Patent of the United States is:

1. A sheet-metal casing, comprising:

at least two sheet-metal parts;

a plastic seal arranged between the sheet-metal parts, wherein a first sheet-metal part is bent along the seal so as to form a step and comes into contact with the second sheet-metal part in such a way that a gap for accommodating the seal forms between the first and second sheet-metal parts with the seal having an exposed side, and the first and second sheet-metal parts of the casing are bent in a sealing area inward into the sheet-metal casing so as to form in the sealing area sealing surfaces to accommodate the seal, whereby the seal is located between the sealing surfaces.

2. The sheet-metal casing as claimed in claim 1, wherein an edge of the second sheet-metal part is bent upward in the sealing region and covers the sealing region from the casing interior.

3. The sheet-metal casing as claimed in claim 2, wherein the casing has a top side and a bottom side, the sealing surfaces being arranged so as to rise inward toward the top side in order to prevent ingress of water.

4. The sheet-metal casing as claimed in claim 3, wherein, in the sealing region, the first sheet-metal part (1) is arranged at a top side and the second sheet-metal part is arranged at a bottom side of the casing, and the margin of the second sheet-metal part is bent toward the top side.

5. The sheet-metal casing as claimed in claim 1, which comprises tension means for drawing together the first sheet-metal part and the second sheet-metal part.

6. The sheet-metal casing as claimed in claim 1, wherein the seal seals off the step from the outside.

7. The sheet-metal casing as claimed in claim 1, wherein the first sheet-metal part is bent towards the second sheet-metal part to form a fold, the fold forming the step.

* * * * *